United States Patent [19]

Hinshaw

[11] Patent Number: 4,879,891

[45] Date of Patent: Nov. 14, 1989

[54] METHOD OF MANUFACTURING HEAT SINK APPARATUS

[75] Inventor: Howard G. Hinshaw, Dallas, Tex.

[73] Assignee: Thermalloy Incorporated, Dallas, Tex.

[21] Appl. No.: 361,484

[22] Filed: Jun. 5, 1989

Related U.S. Application Data

[60] Division of Ser. No. 262,695, Oct. 26, 1988, which is a continuation of Ser. No. 42,706, Apr. 27, 1987, abandoned.

[51] Int. Cl.⁴ .............................................. B21C 23/00
[52] U.S. Cl. ................................. 72/254; 29/157.3 R; 29/558; 83/303; 165/80.3; 165/80.4; 361/383
[58] Field of Search ................... 72/254; 29/557, 558, 29/163.6, 157.3 R; 83/875, 876, 878, 303, 508.3; 165/80.3, 80.4, 185; 310/64, 89; 361/383

[56] References Cited

U.S. PATENT DOCUMENTS

| | | | |
|---|---|---|---|
| 2,965,819 | 12/1960 | Rosenbaum | 165/80.3 X |
| 3,180,404 | 4/1965 | Nelson et al. | 165/80.3 X |
| 3,242,984 | 3/1966 | Delpeyroux et al. | 165/185 |
| 3,313,389 | 4/1967 | Coe | 165/80.3 |
| 3,347,289 | 10/1967 | Katesovec et al. | 83/876 |
| 3,508,117 | 4/1970 | Cuzner | 361/383 |
| 3,521,705 | 7/1970 | Beurtheret et al. | 165/185 X |
| 3,651,842 | 3/1972 | McLean | 83/508.3 X |
| 4,203,311 | 5/1980 | O'Connor et al. | 72/254 |
| 4,282,451 | 8/1981 | Bratoljic | 310/64 X |
| 4,658,487 | 4/1987 | Gachot | 72/254 X |

FOREIGN PATENT DOCUMENTS 1213484  4/1960  France .............................. 165/185

OTHER PUBLICATIONS

IBM Technical Disclosure Bulletin-vol. 11, No. 10 Mar. 1969 (by J. R. Bryden).

Primary Examiner—Charlie T. Moon
Attorney, Agent, or Firm—Kanz, Scherback & Timmons

[57] ABSTRACT

Unitary heat sink apparatus for use in removal of heat from a heat generating component is disclosed which includes a heat sink body formed by extrusion. Parallel fins extend outwardly a first predetermined distance from the heat sink body and are separated by a first predetermined number of grooves of a first predetermined depth and width. The ratio of the height of the fins to the width of the grooves is approximately four to one. The first predetermined number of parallel grooves are gang sawed to a second predetermined depth to provide a second and greater predetermined height to the parallel fins such that the new ratio of the second predetermined height of the fins to the width of the parallel grooves is increased to at least six to one. In another embodiment, the heat sink is then rotated ninety degrees and a second predetermined number of grooves are gang sawed at right angles across and through the parallel fins to provide a predetermined number of pins extending outwardly from the heat sink body.

5 Claims, 1 Drawing Sheet

METHOD OF MANUFACTURING HEAT SINK APPARATUS

This application is a division of application Ser. No. 07/262,695 filed Oct. 26, 1988 which is a continuation of application Ser. No. 07/042,706 filed Apr. 27, 1987 entitled Heat Sink Apparatus and Method of Manufacture, now abandoned.

This invention relates to apparatus for dissipation of thermal energy generated by semiconductor devices. More particularly, it relates to heat sink apparatus designed to be used with semiconductor encasement structures and packages to dissipate thermal energy generated by such devices into the surrounding environment and to methods of manufacturing such heat sink apparatus.

Many semiconductor devices generate heat during operation which must be dissipated to avoid damage to the device. Some such devices have power-handling limitations which are largely determined by their ability to expel internally-generated heat and thereby avoid general or localized thermal degradations or failures within them.

In some semiconductor devices, the internally-generated heat is dissipated sufficiently by the enclosure, header or leads of the device. In many semiconductor devices, however, it is necessary to aid the dissipation of internally-generated heat by the use of heat sinks. A wide variety of heat sink designs have been employed for dissipation of internally-generated heat from electronic device packages which house semiconductor devices. For the purposes of the present invention, a heat sink is any body of metal or like material which is placed in contact with an electronic device package for transferring internally-generated heat from the semiconductor device contained in the electronic device package and for rapid dissipation of the internally-generated heat to the atmosphere by conduction, convection and/or radiation.

Generally, heat sinks are constructed of materials, usually metals such as aluminum, aluminum alloys, copper and copper alloys, having high coefficients of thermal conduction and are formed into shapes adapted to convect or radiate heat at a high rate. As electronic device packages become more compact and generate more heat, more efficient heat sinks must be devised.

In order for the heat sink to operate efficiently, it must be secured to and placed in good thermal contact with the electronic device package. Various means have been used to attach a heat sink in good thermal contact with an electronic device package. It is known to glue or otherwise adhesively attach a heat sink to a predetermined surface of the electronic device package with from the electronic device package. Heat sinks are also mechanically attached to electronic device packages such as by resilient metal clips mounted on the heat sinks which urge the heat sinks and the electronic device packages into mutual contact. The clips enable the heat sinks to be easily removed from the electronic device packages.

It is also desireable to apply various surface treatments to the exterior surfaces of heat sinks. Such surface treatments may include, but are not limited to, anodization, electrodeposition, diffusion coating, galvanization, cladding, sprayed metal or paint coatings and conversion coatings as well as various forms of enamels, plastics, rubbers and vacuum-deposited coatings. These treatments are beneficial in that they protect the heat sink from corrosion caused by moisture or other materials in the environment. In addition, certain of the surface treatments described above enable the heat sink to be selectively colored. Darker colors are desireable in that they enhance the ability of the heat sink to radiate heat to the atmosphere during use.

The present invention provides apparatus for removal of heat from a heat generating component which avoids many of the prior art deficiencies, including poor heat transfer efficiency and complicated mounting hardware.

The present invention provides unitary heat sink apparatus for the use in removal of heat from heat generating components and methods for manufacturing such apparatus. The heat sink apparatus, in one embodiment, comprises a heat sink body formed by extrusion which includes a base portion having a base surface capable of being positioned in thermally conductive contact with a heat generating component. A predetermined number of parallel fins extend outwardly a first predetermined distance from the heat sink body and are separated by a first predetermined number of parallel grooves of a first predetermined width and a first predetermined depth. The ratio of the first predetermined height of the parallel fins to the first predetermined width of the parallel grooves is approximately four to one. The first predetermined number of parallel grooves is then sawed to a second predetermined depth to provide a second predetermined height to the parallel fins such that the ratio of the second predetermined height of the parallel fins to the first predetermined width of the parallel grooves is increased to at least six to one. The exterior surfaces of the unitary heat sink apparatus are then surface treated by anodization, electrodeposition or the like.

In another embodiment the unitary heat sink of the first embodiment is rotated horizontally with respect to its position during the sawing of the first predetermined number of parallel grooves to the second predetermined depth and a second predetermined number of parallel grooves are sawed at an angle across and through the predetermined number of parallel fins to provide a predetermined number of pins which are positioned to form a first predetermined number of parallel rows of pins along a first dimension of the unitary heat sink apparatus and to form a second predetermined number of parallel rows of pins which are disposed along a second dimension.

Among the advantages offered by the present invention is the increase of heat dissipating surface area of the heat sink apparatus for a given area of contact with the heat generating component. The invention also allows forced cooling air to be applied from any side or be directed onto the top of the unitary heat sink apparatus. The invention provides for making heat sink apparatus in which the ratio of fin height to groove width is at least six to one by simple methods of manufacture.

Examples of the more important features and advantages of the invention have been summarized rather broadly in order that the following detailed description may be better understood and in order that the contribution to the art may be better appreciated. There are, of course, additional features of the invention which may be described hereinafter. Other features of the invention will become apparent with reference to the following detailed description of a presently preferred embodiment thereof taken in connection with the accompanying drawing in which.

Heat sinks for semiconductor device packages are usually formed by extrusion processes or by stamping aluminum or aluminum alloys because these processes are highly efficient and cost-effective. As semiconductor device packages become more compact and generate more heat, the need arises for more efficient heat sink apparatus. It will be appreciated that the efficiency of the heat sink apparatus is increased by increasing the surface area of the heat dissipating surfaces of the heat sink apparatus and is even further increased when forced air cooling is used in conjunction with heat dissipating surfaces.

One method to provide an increase in the heat dissipating surface is to provide the heat sink apparatus with fins. It will be appreciated that the fins should have sufficient thickness to be mechanically stable and should be spaced apart at least 0.060 to 0.080 inch to allow adequate airflow across or along the surfaces of the fins. It has been determined that one means to increase the efficiency of fins on heat sink apparatus is to provide fins which have a ratio of the height of the fins to the spacing dimension between the fins of at least six or eight to one. Unfortunately, thin closely-spaced fins cannot be successfully extruded where the fin height to spacing ratio exceeds approximately four to one. Similarly, multi-finned heat sinks with long parallel fins are extremely difficult to manufacture by stamping processes.

Figure 1:
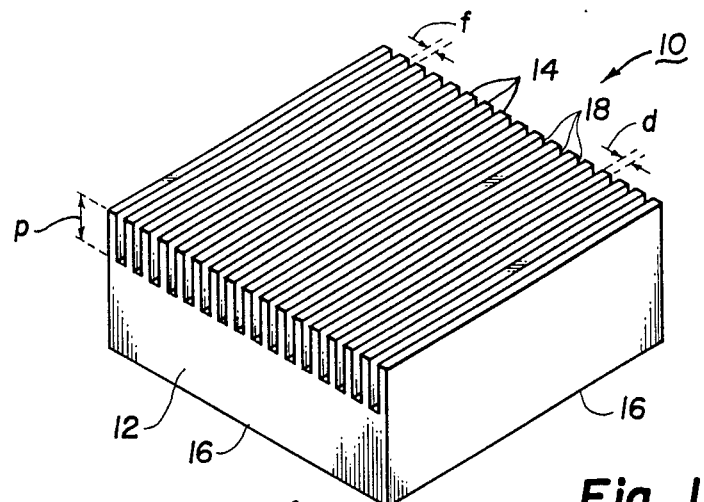
FIG. 1 is a simplified perspective view of heat sink apparatus at a predetermined stage of fabrication in accordance with the present invention.

Referring to the drawing, wherein like reference numerals designate like or corresponding elements throughout the several views, heat sink apparatus for removal of heat from a heat generating component is referred to generally by reference numeral 10. With reference to FIG. 1, heat sink apparatus 10 is disclosed as it appears during a particular phase of manufacture or fabrication thereof and comprises a unitary member constructed from material capable of being extruded and having a high heat transfer coefficient. The heat sink apparatus 10 is preferably constructed from aluminum, aluminum alloys, copper, copper alloys or the like.

The heat sink apparatus 10 as disclosed in FIG. 1 has been formed by extrusion wherein the fin height to spacing ratio is approximately four to one. The extrusion process is used during this first phase of manufacture in order to conserve material and process time. The heat sink apparatus 10 comprises a base portion 12 with a predetermined number of parallel fins 14 projecting a predetermined distance or height p from the upper portion of said base portion 12 and at a predetermined angle from said base portion 12. In the preferred embodiments, the predetermined angle is approximately ninety degrees.

The base portion 12 includes a base surface 16 which is smooth and flat and, in the preferred embodiments, is rectangular or square in shape. The base surface, however, may be of any shape and dimensions required to mate with the required surface or the device package.

The parallel fins 14 are separated by parallel grooves 18 which are of a predetermined width f as measured between adjacent parallel fins 14 and are of a predetermined width d. As will be appreciated, the depth of the parallel grooves 18 is equal to the height p of the parallel fins 14 from base portion 12. The height of the base portion 12 is measured from the base surface 16 to the bottom surface 20 of the parallel grooves 18. The bottom of surface 20 is in the same plane as the upper portion of the base portion 12. As previously noted with respect to the heat sink 10 disclosed in FIG. 1, the ratio of the height of parallel fins 14 to the spacing or width of parallel grooves 18 is approximately four to one.

One method of increasing the efficiency of the heat sink apparatus 10 is to increase the ratio of fin height to spacing dimension between the fins to a value greater than approximately four to one. This increase in efficiency of the heat sink apparatus 10 of FIG. 1 may be accomplished by increasing the depth of the parallel grooves 18. One method of increasing the depth of the parallel grooves 18 is by sawing with an appropriate sawing device which will provide gang sawing of all the parallel grooves 18 simultaneously to the same depth and which will result in a ratio of fin height to groove width of at least six to one and preferrably of at least eight to one.

Figure 2:
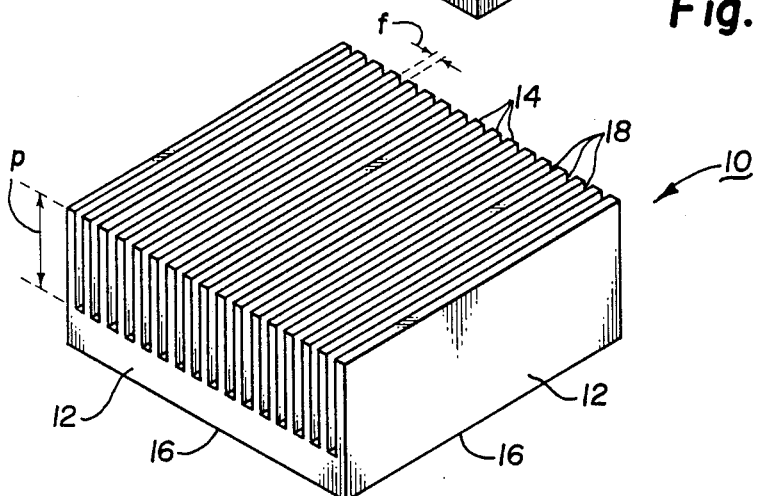
FIG. 2 is a simplified perspective view of one embodiment of heat sink apparatus according to the present invention.

With reference to FIG. 2, heat sink apparatus 10 is disclosed which has a fin height to groove width ratio of at least six to one. A specific embodiment of the heat sink 10 of FIG. 2 which is to be used with a gate array semiconductor device has a base surface approximately one and one-half inches square with parallel fins 14 approximately 0.80 inch in height and approximately 0.060 inch in width and parallel grooves 18 approximately 0.07 inch wide. It will be appreciated that this ratio of fin height to groove width may be provided for and with a great variety of base surface dimensions for various semiconductor device packages. The base surface 16 will be positioned against the heat transfer surface of the semiconductor device package and held in contact with the same for good thermal transfer between the two surfaces. The preferred method to maintain good thermal contact between the two surfaces is to glue or otherwise adhesively attach the two surfaces together.

With further reference to FIG. 2, it will be appreciated that: another method may be used to provide heat sink apparatus 10 with the desired ratio of fin height to groove width. This method includes the steps of providing a block or blank form of preferred material and then sawing the required number of grooves of desired width in the material in single saw passes or with ganged saws without first extruding a heat sink with the shorter parallel fins. The saw cuts, of course, must be parallel and separated the correct distance to provide the desired fin width. It will be appreciated that both methods provide essentially the same heat sink apparatus 10 as shown in FIG. 2. In both processes of fabrication of the heat sink apparatus 10, the heat sink is anodized or otherwise treated for protection against corrosion and to enhance the heat dissipation characteristics thereof.

Figure 3:
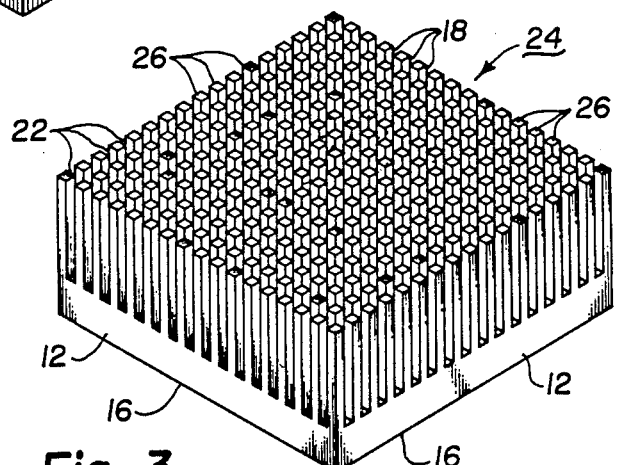
FIG. 3 is a simplified perspective view of another embodiment of heat sink apparatus according to the present invention.

To further improve the overall efficiency of heat sink 10, heat sink apparatus 10 may be rotated (preferably ninety degrees) prior to andoizing and gang sawed to form a predetermined number of parallel grooves 22 of predetermined width at an angle to parallel grooves 18, thus providing a dense pin heat sink apparatus 24 as shown in FIG. 3. This method converts the parallel fins 14 to a multiplicity of pins 26 which are arranged in parallel rows and increases the surface area of the heat dissipating surfaces (previously provided by the parallel fins) for given dimensions of base surface 16. An additional advantage is that forced cooling air can be applied from any side of the well as being applied directly down onto the top of the pins 26 of dense pin heat sink apparatus 24. It will be observed that when the groove width formed by the sawing in both directions is approximately equal to the fin width, the pin surface area (viewed from the top) is approximately twenty-five percent (25%) of the surface area of the base surface. However, each pin now presents four vertical surfaces to the atmosphere for dissipation of heat. However, when the groove width is less than the fin width, converting the parallel fins to pins increases both the density in number of pins per unit of area and the surface area of pins exposed to the environment. Thus the invention permits the formation or heat sinks with very high area of exposed surface area to base surface area.

Although the invention has been described herein with reference to specific forms thereof, many alternatives, modifications and variations will become apparent to those skilled in the art in light of the foregoing disclosure. Accordingly, this description is to be construed as illustrative only and is for the purpose of teaching those skilled in the art the manner of carrying out the invention. It is to be understood that the forms of the invention shown and described in detail are to be taken as the presently preferred embodiments. Various changes may be made in the shape, size and arrangement of parts. For example, equivalent elements may be substituted for those illustrated and described herein, parts may be reversed, and certain features of the invention may be utilized independently of other features of the invention. It will be appreciated, therefore, that various modifications, alternatives, variations, etc., may be made without departing from the spirit and scope of the invention as defined by the appended claims.

What is claimed:

1. The method of forming a unitary heat sink metal body for use in removal of heat from a heat generating electronic device package comprising the steps of:
   (a) extruding a unitary metal body of heat conducting material having a base surface on a first side thereof adapted to be positioned in thermally conductive contact with a heat generating electronic device package, said body including a predetermined number of parallel fins extending outwardly a first predetermined height from a side opposite said base surface, said predetermined number of parallel fins separated by a first predetermined number of parallel grooves of a first predetermined width and a first predetermined depth with the ratio of said first predetermined height to said first predetermined width being at least four to one; and
   (b) sawing the first predetermined number of parallel grooves to a second predetermined depth to provide a second predetermined height to said parallel fins, whereby the ratio of the second predetermined height of said predetermined number of parallel fins to the first predetermined width of said first predetermined number of parallel grooves is at least six to one.

2. The method set forth in claim 1 further including the step of sawing a second predetermined number of parallel grooves across and through said predetermined number of parallel fins to form a second predetermined number of parallel grooves having a third predetermined depth and a third predetermined width to form pins.

3. The method set forth in claim 2 wherein said third predetermined depth is substantially equal to said second predetermined depth.

4. The method set forth in claim 1 further including the step of surface treating the exterior surfaces of said unitary heat sink body.

5. The method set forth in claim 2 further including the step of surface treating the exterior surfaces of said unitary heat sink body.

* * * * *

UNITED STATES PATENT AND TRADEMARK OFFICE
CERTIFICATE OF CORRECTION

PATENT NO. : 4,879,891

DATED : November 14, 1989

INVENTOR(S) : Howard G. Hinshaw

It is certified that error appears in the above-identified patent and that said Letters Patent is hereby corrected as shown below:

```
Column 1, line 55,  between "with" and "from" insert ---heat-
     conductive epoxy or the like which allows removal of
     heat---
Column 2, line 66,  change "may" to ---will---
Column 4, line 47,  delete the colon (:)
Column 5, line 6,   after "the" insert ---dense pin heat sink
     apparatus 24 as---
```

Signed and Sealed this

Third Day of December, 1991

Attest:

HARRY F. MANBECK, JR.

Attesting Officer

Commissioner of Patents and Trademarks